(12) United States Patent
Albert et al.

(10) Patent No.: US 7,916,391 B2
(45) Date of Patent: Mar. 29, 2011

(54) APPARATUS FOR PROVIDING A PATTERN OF POLARIZATION

(75) Inventors: Michael Albert, Stamford, CT (US); Damian Fiolka, Oberkochen (DE)

(73) Assignees: Carl Zeiss SMT GmbH, Oberkochen (DE); ASML Holding NV, Veldhoven (NL)

( * ) Notice: Subject to any disclaimer, the term of this patent is extended or adjusted under 35 U.S.C. 154(b) by 858 days.

(21) Appl. No.: 11/569,001

(22) PCT Filed: Mar. 4, 2005

(86) PCT No.: PCT/EP2005/050981
§ 371 (c)(1),
(2), (4) Date: Jul. 25, 2007

(87) PCT Pub. No.: WO2005/116772
PCT Pub. Date: Dec. 8, 2005

(65) Prior Publication Data
US 2008/0130109 A1   Jun. 5, 2008

Related U.S. Application Data

(63) Continuation-in-part of application No. 10/852,099, filed on May 25, 2004, now Pat. No. 7,324,280.

(51) Int. Cl.
*G02B 27/28* (2006.01)
(52) U.S. Cl. .......... 359/489; 359/497; 359/501; 355/71
(58) Field of Classification Search .................. None
See application file for complete search history.

(56) References Cited

U.S. PATENT DOCUMENTS

| | | | |
|---|---|---|---|
| 2,473,857 A | 6/1949 | Burchell | |
| 3,438,692 A | 4/1969 | Tabor | |
| 3,484,714 A | 12/1969 | Koester et al. | |
| 3,630,598 A | 12/1971 | Little, Jr. | |
| 3,719,415 A | 3/1973 | Rawson | |
| 3,892,470 A | 7/1975 | Lotspeich | |
| 4,175,830 A | 11/1979 | Marie | |
| 4,272,158 A | 6/1981 | Johnston, Jr. et al. | |

(Continued)

FOREIGN PATENT DOCUMENTS

DE    195 20 563 A1    12/1996

(Continued)

OTHER PUBLICATIONS

PCT International Preliminary Report on Patentability for International Application No. PCT/EP2005/050981, dated Nov. 29, 2006.

(Continued)

*Primary Examiner* — Arnel C Lavarias
(74) *Attorney, Agent, or Firm* — Cahn & Samuels, LLP

(57) ABSTRACT

A polarization pattern assembly for use in an illuminator and an apparatus for providing at least one polarization pattern in a pupil of an illuminator for a lithography system are provided. A polarization pattern assembly for use in an illuminator having a pupil includes a frame (110) and at least one polarization pane (102, 102a, 102b) coupled to the frame (110), the polarization pane (102, 102a, 102b) changing a direction of polarization of light passing therethrough, whereby at least one polarization pattern is obtained across the pupil of the illuminator, and wherein the polarization pane (102, 102a, 102b) includes an optically active material.

37 Claims, 13 Drawing Sheets

U.S. PATENT DOCUMENTS

| | | |
|---|---|---|
| 4,286,843 A | 9/1981 | Reytblatt |
| 4,712,880 A | 12/1987 | Shirasaki |
| 4,744,615 A | 5/1988 | Fan et al. |
| 4,755,027 A | 7/1988 | Schafer |
| 5,300,972 A | 4/1994 | Kamon |
| 5,345,292 A | 9/1994 | Shiozawa et al. |
| 5,365,371 A | 11/1994 | Kamon |
| 5,382,999 A | 1/1995 | Kamon |
| 5,436,761 A | 7/1995 | Kamon |
| 5,459,000 A | 10/1995 | Unno |
| 5,471,343 A | 11/1995 | Takasugi |
| 5,541,026 A | 7/1996 | Matsumoto |
| 5,559,583 A | 9/1996 | Tanabe |
| 5,621,498 A | 4/1997 | Inoue et al. |
| 5,627,626 A | 5/1997 | Inoue et al. |
| 5,663,785 A | 9/1997 | Kirk et al. |
| 5,673,103 A | 9/1997 | Inoue et al. |
| 5,677,755 A | 10/1997 | Oshida et al. |
| 5,707,501 A | 1/1998 | Inoue et al. |
| 5,739,898 A | 4/1998 | Ozawa et al. |
| 5,815,247 A | 9/1998 | Poschenrieder |
| 5,841,500 A | 11/1998 | Patel |
| 5,867,315 A | 2/1999 | Koike et al. |
| 5,933,219 A | 8/1999 | Unno |
| 6,031,658 A | 2/2000 | Riza |
| 6,191,880 B1 | 2/2001 | Schuster et al. |
| 6,211,944 B1 | 4/2001 | Shiraishi |
| 6,229,647 B1 | 5/2001 | Takahashi et al. |
| 6,233,041 B1 | 5/2001 | Shiraishi |
| 6,246,506 B1 | 6/2001 | Kobayashi et al. |
| 6,252,712 B1 | 6/2001 | Furter et al. |
| 6,259,512 B1 | 7/2001 | Mizouchi |
| 6,285,443 B1 | 9/2001 | Wangler et al. |
| 6,310,679 B1 | 10/2001 | Shiraishi |
| 6,361,909 B1 | 3/2002 | Gau et al. |
| 6,392,800 B2 | 5/2002 | Schuster |
| 6,404,482 B1 | 6/2002 | Shiraishi |
| 6,452,662 B2 | 9/2002 | Mulkens et al. |
| 6,535,273 B1 | 3/2003 | Maul |
| 6,538,247 B2 | 3/2003 | Iizuka |
| 6,553,156 B1 | 4/2003 | Li |
| 6,583,931 B2 | 6/2003 | Hiraiwa et al. |
| 6,636,295 B2 | 10/2003 | Shiozawa |
| 6,721,258 B1 | 4/2004 | Hashimoto et al. |
| 6,769,273 B1 | 8/2004 | Nakagawa et al. |
| 6,842,223 B2 | 1/2005 | Tyminski |
| 6,856,379 B2 | 2/2005 | Schuster |
| 6,885,502 B2 | 4/2005 | Schuster |
| 6,913,373 B2 | 7/2005 | Tanaka et al. |
| 6,934,009 B2 | 8/2005 | Terashi |
| 6,943,941 B2 | 9/2005 | Flagello |
| 6,965,484 B2 | 11/2005 | Shaver |
| 6,970,233 B2 | 11/2005 | Blatchford |
| 7,009,686 B2 | 3/2006 | Kawashima et al. |
| 7,038,763 B2 | 5/2006 | Mulder et al. |
| 7,113,260 B2 | 9/2006 | Schuster et al. |
| 7,126,667 B2 | 10/2006 | Kawashima et al. |
| 7,126,673 B2 | 10/2006 | Mori |
| 7,145,720 B2 | 12/2006 | Krähmer et al. |
| 7,199,864 B2 | 4/2007 | Gerhard |
| 7,199,936 B2 | 4/2007 | Williams et al. |
| 7,239,375 B2 | 7/2007 | Tsuji |
| 7,265,816 B2 | 9/2007 | Tsuji |
| 7,292,315 B2 | 11/2007 | Socha et al. |
| 7,304,719 B2 | 12/2007 | Albert et al. |
| 7,345,740 B2 | 3/2008 | Wagner et al. |
| 7,345,741 B2 | 3/2008 | Shiozawa et al. |
| 7,375,887 B2 | 5/2008 | Hansen et al. |
| 7,386,830 B2 | 6/2008 | Fukuhara |
| 7,408,616 B2 | 8/2008 | Gruner et al. |
| 7,408,622 B2 | 8/2008 | Fiolka et al. |
| 7,411,656 B2 | 8/2008 | Totzeck et al. |
| 7,436,491 B2 | 10/2008 | Fukuhara |
| 7,445,883 B2 | 11/2008 | Baba-Ali et al. |
| 7,446,858 B2 | 11/2008 | Kudo et al. |
| 7,499,148 B2 | 3/2009 | Yamada et al. |
| 7,511,884 B2 | 3/2009 | Flagello et al. |
| 2001/0012154 A1 | 8/2001 | Schuster |
| 2001/0019404 A1 | 9/2001 | Schuster et al. |
| 2002/0024008 A1 | 2/2002 | Iizuka |
| 2002/0085176 A1 | 7/2002 | Hiraiwa et al. |
| 2002/0085276 A1 | 7/2002 | Tanitsu et al. |
| 2002/0126380 A1 | 9/2002 | Schuster |
| 2002/0149847 A1 | 10/2002 | Osawa |
| 2002/0152452 A1 | 10/2002 | Socha |
| 2002/0163629 A1 | 11/2002 | Switkes et al. |
| 2002/0176166 A1 | 11/2002 | Schuster |
| 2002/0177048 A1 | 11/2002 | Saitoh et al. |
| 2002/0177054 A1 | 11/2002 | Saitoh et al. |
| 2002/0186462 A1 | 12/2002 | Gerhard |
| 2002/0191288 A1 | 12/2002 | Gruner et al. |
| 2002/0196416 A1 | 12/2002 | Shiraishi |
| 2003/0007158 A1 | 1/2003 | Hill |
| 2003/0038225 A1 | 2/2003 | Mulder et al. |
| 2003/0053036 A1 | 3/2003 | Fujishima et al. |
| 2003/0086070 A1 | 5/2003 | Goo et al. |
| 2003/0095241 A1 | 5/2003 | Burghoom |
| 2003/0160949 A1 | 8/2003 | Komatsuda et al. |
| 2004/0012764 A1 | 1/2004 | Mulder et al. |
| 2004/0169924 A1 | 9/2004 | Flagello et al. |
| 2004/0184019 A1 | 9/2004 | Totzeck et al. |
| 2004/0240073 A1 | 12/2004 | Gerhard |
| 2005/0164522 A1 | 7/2005 | Kunz et al. |
| 2005/0195480 A1 | 9/2005 | Brown et al. |
| 2005/0219696 A1 | 10/2005 | Albert et al. |
| 2005/0264885 A1 | 12/2005 | Albert |
| 2005/0286038 A1 | 12/2005 | Albert et al. |
| 2006/0052428 A1 | 3/2006 | Chez |
| 2006/0055834 A1 | 3/2006 | Tanitsu et al. |
| 2006/0072095 A1 | 4/2006 | Kudo et al. |
| 2006/0092398 A1 | 5/2006 | Mccarthy |
| 2006/0119826 A1 | 6/2006 | Gerhard |
| 2006/0139611 A1 | 6/2006 | Wagner et al. |
| 2006/0146384 A1 | 7/2006 | Schultz et al. |
| 2006/0158624 A1 | 7/2006 | Toyoda |
| 2006/0170901 A1 | 8/2006 | Tanitsu et al. |
| 2006/0203214 A1 | 9/2006 | Shiraishi |
| 2006/0221453 A1 | 10/2006 | Koehler et al. |
| 2006/0291057 A1 | 12/2006 | Fiolka |
| 2007/0008511 A1 | 1/2007 | De Boeij et al. |
| 2007/0019179 A1 | 1/2007 | Fiolka et al. |
| 2007/0058151 A1 | 3/2007 | Eurlings et al. |
| 2007/0081114 A1 | 4/2007 | Fiolka et al. |
| 2007/0139636 A1 | 6/2007 | Gerhard |
| 2007/0146676 A1 | 6/2007 | Tanitsu et al. |
| 2007/0222962 A1 | 9/2007 | Kudo |
| 2007/0296941 A1 | 12/2007 | Omura |
| 2008/0024747 A1 | 1/2008 | Kudo et al. |
| 2008/0068572 A1 | 3/2008 | Kudo |
| 2008/0130109 A1 | 6/2008 | Albert et al. |
| 2008/0218725 A1 | 9/2008 | Fiolka |
| 2008/0316459 A1 | 12/2008 | Fiolka et al. |
| 2008/0316598 A1 | 12/2008 | Fiolka |
| 2009/0002675 A1 | 1/2009 | Fiolka et al. |
| 2009/0073414 A1 | 3/2009 | Tanitsu et al. |
| 2009/0073441 A1 | 3/2009 | Tanitsu et al. |
| 2009/0122292 A1 | 5/2009 | Shiraishi |
| 2009/0147233 A1 | 6/2009 | Toyoda |
| 2009/0147234 A1 | 6/2009 | Toyoda |
| 2009/0147235 A1 | 6/2009 | Toyoda |
| 2009/0185156 A1 | 7/2009 | Kudo et al. |
| 2009/0275420 A1 | 11/2009 | Tanaka |
| 2009/0284729 A1 | 11/2009 | Shiraishi |
| 2009/0296066 A1 | 12/2009 | Fiolka |
| 2009/0316132 A1 | 12/2009 | Tanitsu et al. |
| 2009/0323041 A1 | 12/2009 | Toyoda |
| 2010/0045957 A1 | 2/2010 | Fiolka |
| 2010/0177293 A1 | 7/2010 | Fiolka et al. |

FOREIGN PATENT DOCUMENTS

| | | |
|---|---|---|
| DE | 196 21 512 A1 | 12/1997 |
| DE | 198 07 120 A1 | 8/1999 |
| EP | 0 764 858 A2 | 3/1997 |
| EP | 08 23662 A2 | 2/1998 |
| EP | 1 720 199 A1 | 11/2006 |
| GB | 856621 A | 12/1960 |
| JP | 61-091662 A | 5/1986 |

| | | | |
|---|---|---|---|
| JP | 62-265722 A | 11/1987 |
| JP | 63-044726 A | 2/1988 |
| JP | 11-54426 A | 6/1989 |
| JP | 04-101148 A | 4/1992 |
| JP | 04-225357 A | 8/1992 |
| JP | 05-109601 A | 4/1993 |
| JP | 05-283317 A | 10/1993 |
| JP | 05-326370 A | 12/1993 |
| JP | 06-053210 | 2/1994 |
| JP | 06-118623 | 4/1994 |
| JP | 06-124873 A | 5/1994 |
| JP | 06-188169 A | 7/1994 |
| JP | 06-196388 A | 7/1994 |
| JP | 06-204121 A | 7/1994 |
| JP | 07-183201 | 7/1995 |
| JP | 07-201723 | 8/1995 |
| JP | 07-283119 A | 10/1995 |
| JP | 07-307268 A | 11/1995 |
| JP | 9-043401 A | 2/1997 |
| JP | 09-120154 A | 5/1997 |
| JP | 09-184918 A | 7/1997 |
| JP | 09-219358 A | 8/1997 |
| JP | 10-104427 A | 4/1998 |
| JP | 10-303114 A | 11/1998 |
| JP | 2000-114157 A | 4/2000 |
| JP | 2001-274083 A | 10/2001 |
| JP | 2002-075816 A | 3/2002 |
| JP | 2002-075835 A | 3/2002 |
| JP | 2002-231619 A | 8/2002 |
| JP | 2002-324743 A | 11/2002 |
| JP | 2002-334836 A | 11/2002 |
| JP | 2003-35822 A | 2/2003 |
| JP | 2003-059821 A | 2/2003 |
| JP | 2003-297727 A | 10/2003 |
| JP | 2004-179172 A | 6/2004 |
| JP | 2005166871 A | 6/2005 |
| WO | WO 99/49504 | 9/1999 |
| WO | WO 00/02092 | 1/2000 |
| WO | WO 00/67303 | 11/2000 |
| WO | WO 0079331 A1 | 12/2000 |
| WO | WO 02082169 A1 * | 10/2002 |
| WO | WO 02/093209 | 11/2002 |
| WO | WO 2004051717 | 6/2004 |
| WO | WO 2004102273 A2 | 11/2004 |
| WO | WO 2005031467 | 4/2005 |
| WO | WO 2005036619 | 4/2005 |
| WO | WO 2005041277 | 5/2005 |
| WO | WO 2005050718 A1 | 6/2005 |
| WO | WO 2005/069081 A2 | 7/2005 |
| WO | WO 2005/076045 | 8/2005 |
| WO | WO 2006059549 A1 | 6/2006 |
| WO | 2006/077849 A1 | 7/2006 |
| WO | WO 2007039519 A1 | 4/2007 |

OTHER PUBLICATIONS

PCT International Search Report for International Application No. PCT/EP2005/050981, dated Jul. 28, 2005.
English Abstract of JP 10-079337.
English Abstract of JP 06-53120.
English Abstract of JP 06-118623.
English Abstract of JP 07-183201.
English Abstract of JP 07-201723.
English translation of Office Action in JP 2008-239066 dated Sep. 21, 2010.
Hecht, C., "Optics", 4th ed., Chapter 8: Polarization, pp. 348, 349, 360, 366-367 (2002).
*Shafer, et al.* v. *Omura*, Shafer Motions List, for Patent Interference No. 105,678 (SCM) filed Mar. 25, 2009.
*Shafer, et al.* v. *Omura*, "Judgment—Request for Adverse—Bd.R. 127(b)" for Patent Interference No. 105,678 (SCM) filed Aug. 31, 2009.
"Fused quartz", http://en.wikipedia.org/wiki.Fused_quartz, Aug. 27, 2009.
English Abstract of JP 06-188169.
English Abstract of JP 09-120154.
English Abstract of DE 196 21512.
English Abstract of EP 08 23662.
English Abstract of JP 2005166871.
English Abstract of WO 99/49504.
English Abstract of WO 00/02092.
English Abstract of WO 00/67303.
English Abstract of WO 02/093209.
English Abstract of WO 2004051717.
English Abstract of WO 2005036619.
English Abstract of WO 2005031467.
English Abstract of EP 0 764 858.
English Abstract of JP 62-265722.
English Abstract of JP 61-091662.
English Abstract of JP 04-101148.
English Abstract of JP 04-225357.
English Abstract of JP 05-109601.
English Abstract of JP 05-283317.
English Abstract of JP 05-326370.
English Abstract of JP 06-124873.
English Abstract of JP 06-196388.
English Abstract of JP 06-204121.
English Abstract of JP 07-283119.
English Abstract of JP 07-307268.
English Abstract of JP 09-184918.
English Abstract of JP 09-219358.
English Abstract of JP 10-303114.
English Abstract of JP 10-104427.
English Abstract of JP 11-54426.
English Abstract of JP 2000-114157.
English Abstract JP 2001-274083.
English Abstract of JP 6053120.
English Abstract of JP 2002-075835.
English Abstract of JP 2002-075816.
English Abstract of JP 2002-231619.
English Abstract of JP 2002-324743.
English Abstract of JP 2002-334836.
English Abstract of WO 2004102273.
English Abstract of WO 2006059549.
English Abstract of JP 2003-35822.
English Abstract of JP 2003-059821.
English Abstract of JP 2003-297727.
English Abstract of JP 2004-179172.
English Abstract of JP 9-043401.
English Abstract of JP 63-044726.
English Abstract of WO 2005050718.

* cited by examiner

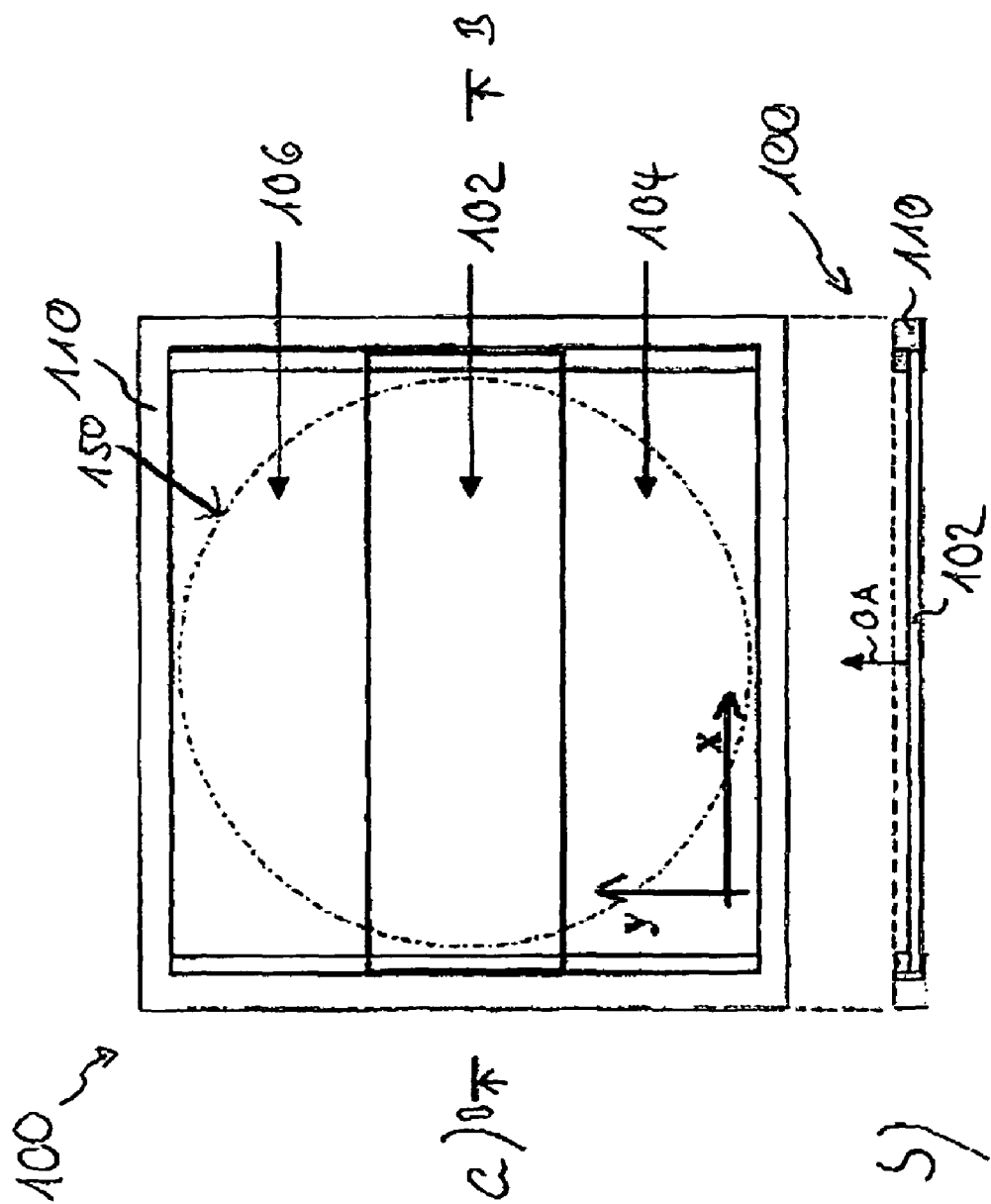
FIG..1

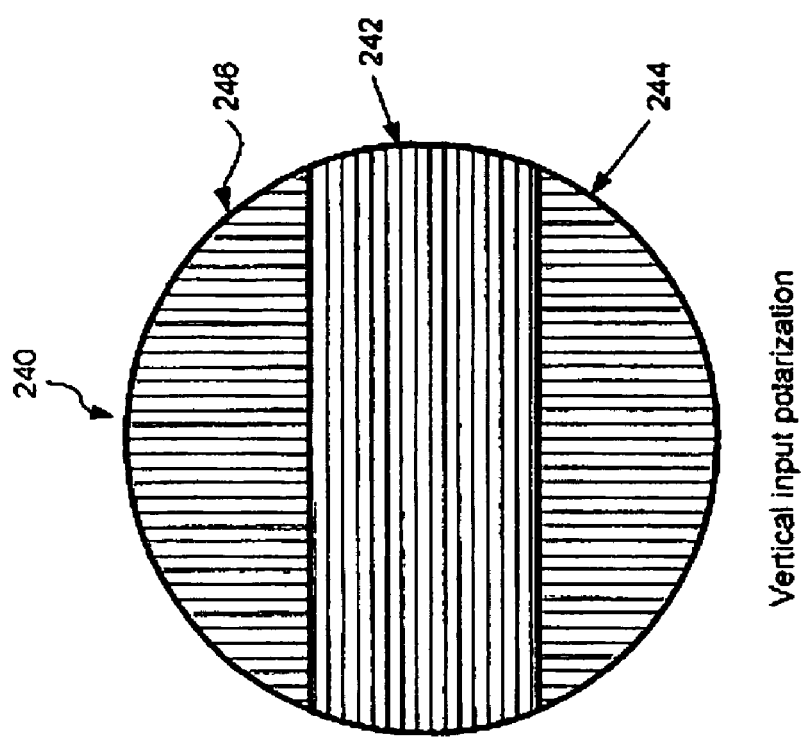
FIG. 2C Vertical input polarization
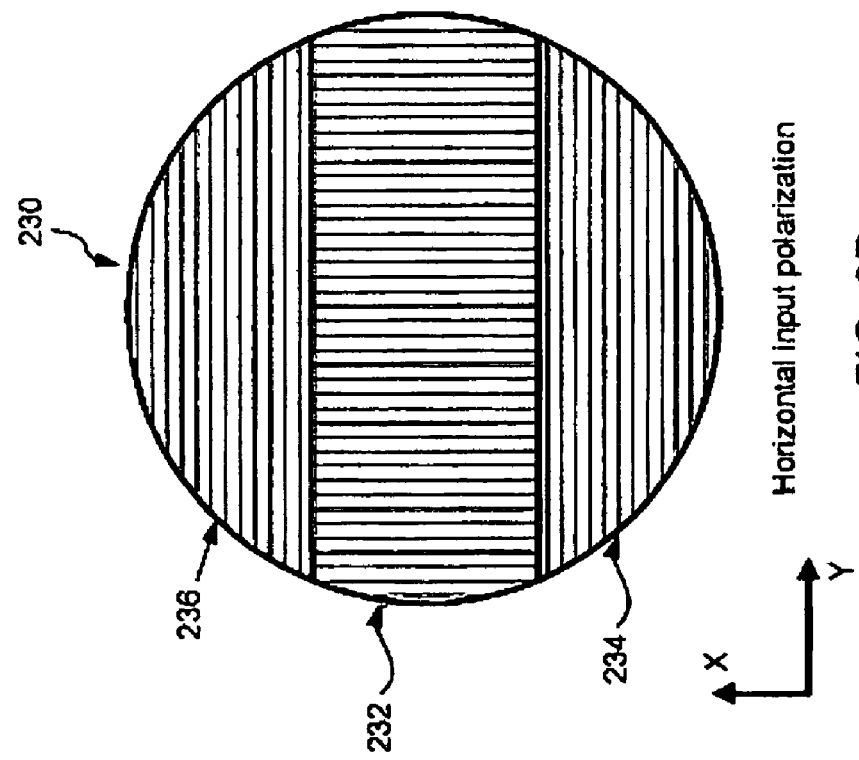
FIG. 2B Horizontal input polarization

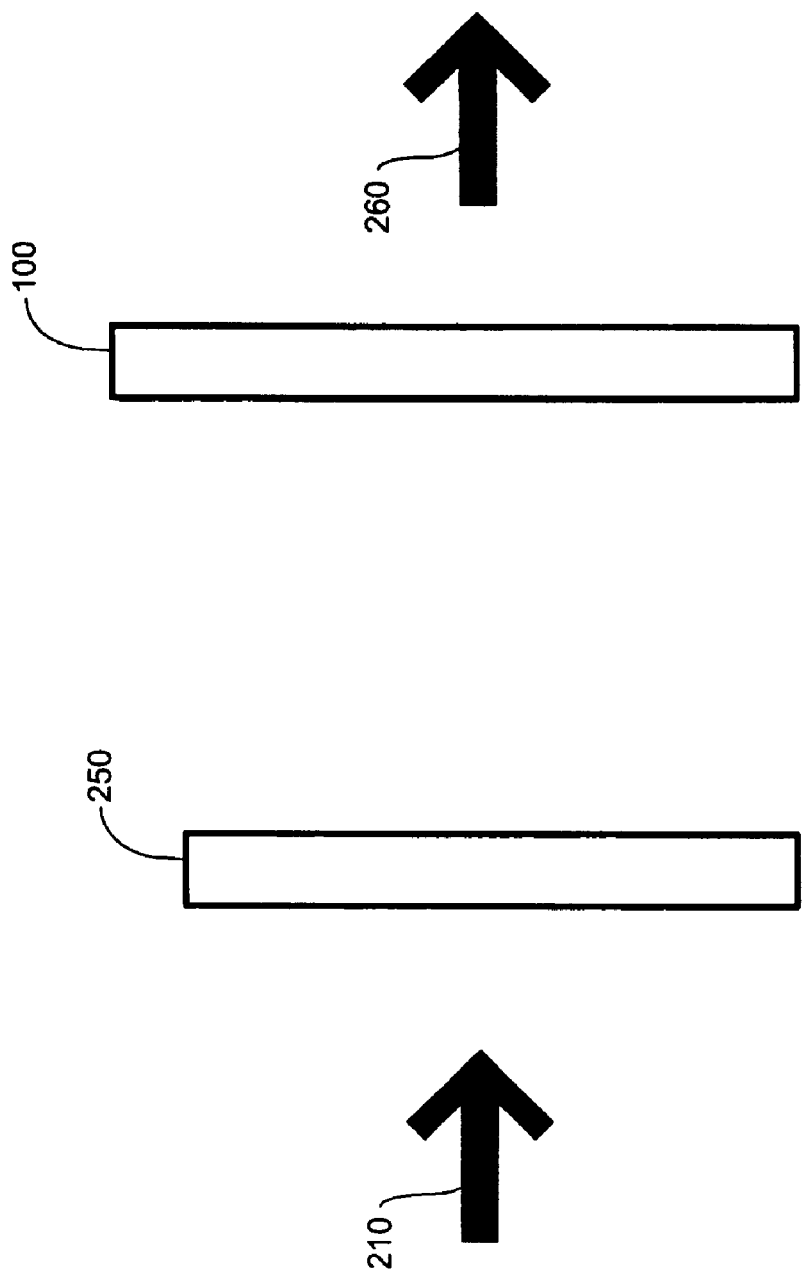

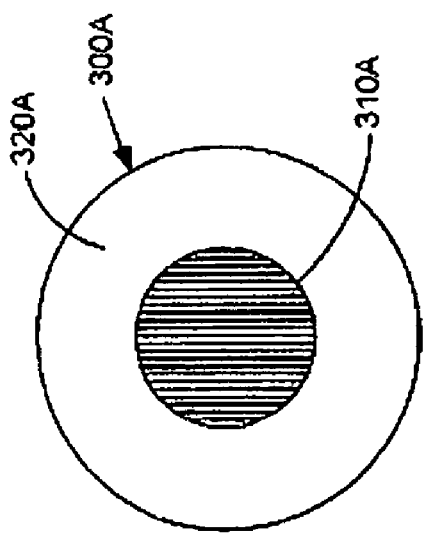 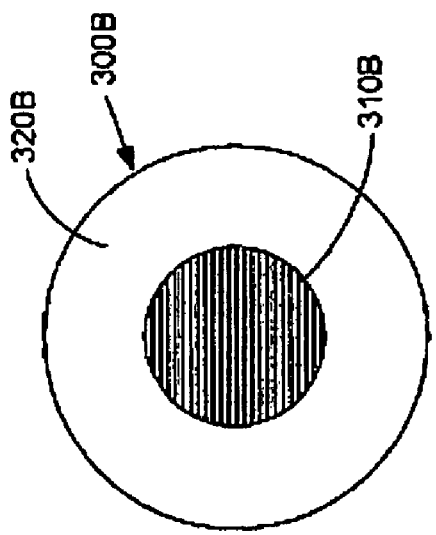

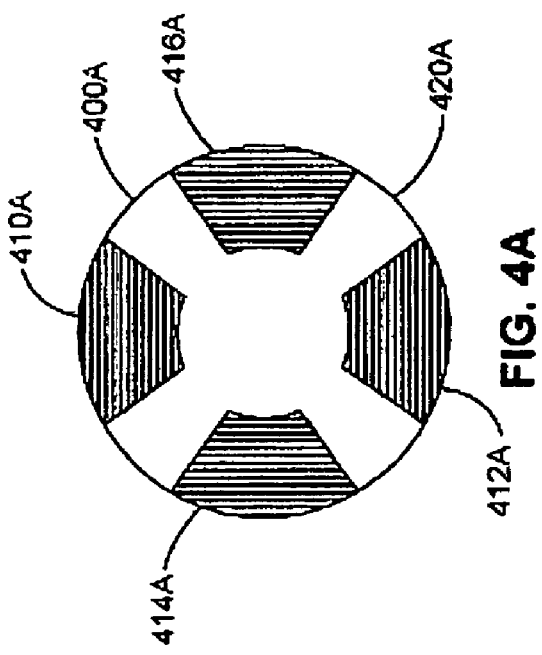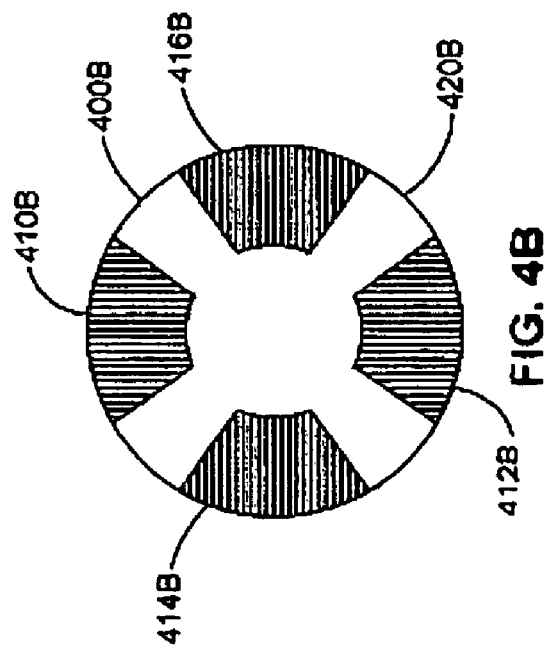

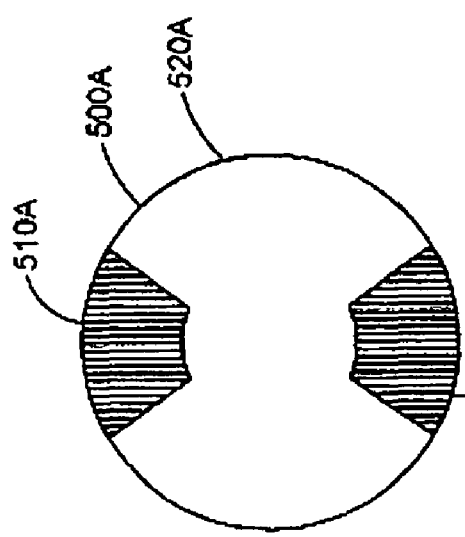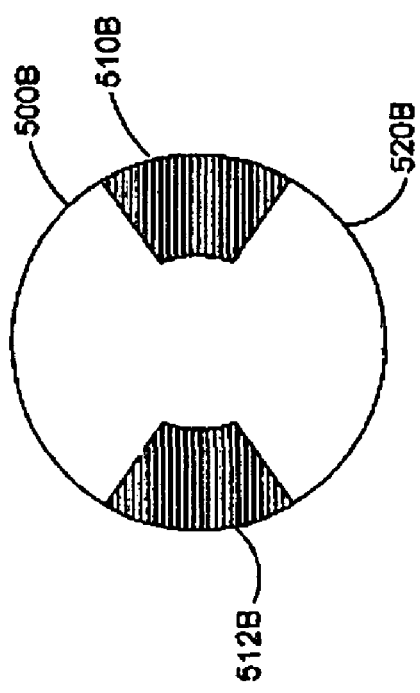

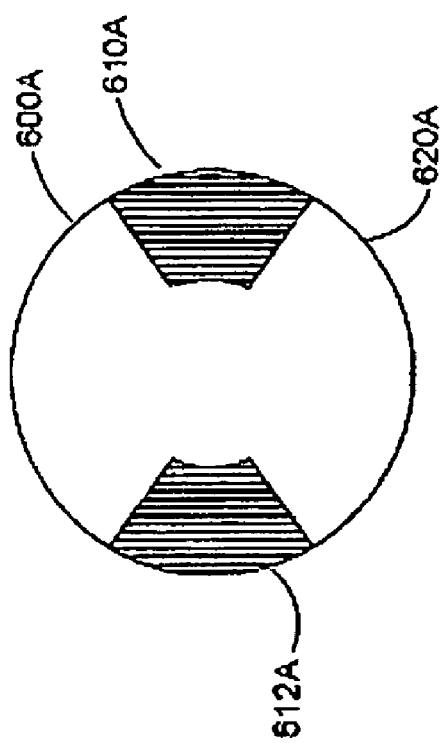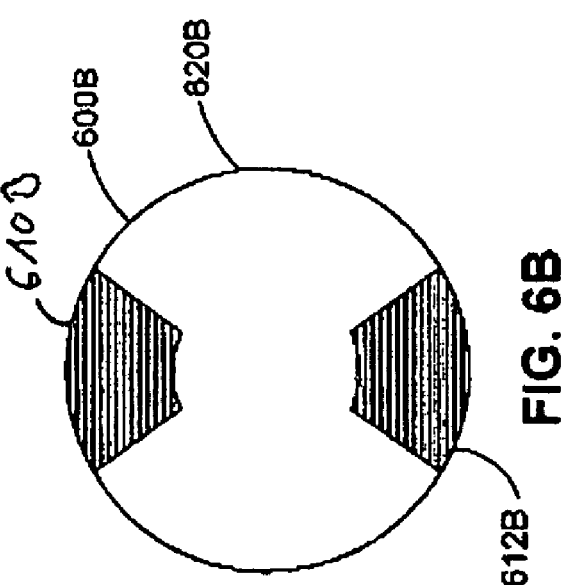

FIG..8

APPARATUS FOR PROVIDING A PATTERN OF POLARIZATION

BACKGROUND OF THE INVENTION

1. Field of the Invention

The present invention relates to optical systems that provide light beams with polarization that varies along the cross section of the beam.

2. Description of the Related Art

In order to create faster and more sophisticated circuitry, the semiconductor industry continually strives to reduce the size of the circuit elements. The circuits are produced primarily by photolithography. In this process, the circuits are printed onto a semiconductor substrate by exposing a coating of radiation sensitive material to light. The radiation sensitive material is often referred to as a "photoresist" or just resist. Passing the light through a mask, which may consist of a pattern of chrome or other opaque material formed on a transparent substrate, generates the desired circuit pattern. The mask may also be formed by a pattern of higher and lower regions etched into the surface of a transparent substrate, or some combination of the two techniques. Subsequent thermal or chemical processing removes only the exposed or only the unexposed regions of the resist (depending on the material) leaving regions of the substrate bare for further processing which in turn produces the electronic circuit.

Projection exposure systems with a higher numerical aperture and shorter exposure wavelength are desired in order to achieve the highest resolutions and decrease the critical dimension (CD) of features being fabricated. Now the polarization of the exposure light at a reticle and at a wafer can have a substantial impact on imaging. For example, polarization at the reticle (or mask) affects the lithographic performance in several ways. First, the interaction of the illumination with features of the reticle, say, for example, dense lines of chrome, can vary with polarization. The transmission and scattering at a mask then depends on the polarization of the light and features of the mask. Second, reflections at the surfaces of lenses and mirrors are polarization dependent so that apodization and to a lesser degree the wave front of the projection optics ("P.O.") depend on polarization. Also, the reflection from the surface of the resist depends on polarization, and this too is effectively a polarization dependent apodization. Finally, the rays diffracted from the reticle that are brought back together at the wafer need to interfere to produce an image (also called vector interference). However, only parallel components of the electric field generally can interfere, so the polarization state of each ray at the wafer affects the coherent imaging.

Accordingly, it is increasingly desirable to provide polarized illumination in lithographic systems. Further, as demand for increased resolution and higher NA systems increases, it is increasingly desirable to control polarization across a pupil. A polarization pattern is needed such that different portions of an exposure beam have different polarizations (i.e., different polarization directions). Desired polarization patterns include radial, tangential or other custom polarization patterns.

Heretofore, creating such polarization patterns has been difficult and expensive. One approach provides a mosaic tile structure made up of many birefringent tiles. Each tile can polarize a corresponding section of an exposure beam in a particular direction. In this way, the mosaic of tiles can create a polarization pattern, such as a radial pattern, across a pupil. See, U.S. Pat. No. 6,191,880. Such a mosaic tile structure, however, uses many tiles to provide the polarization pattern. This mosaic of tiles is complicated and difficult to manufacture. Among other things, a sandwich structure may be needed to hold the individual tiles in place across the width of the exposure beam. This is disadvantageous as differential thermal expansion across the mosaic, especially in natural birefringent crystal material, can prevent optical contact and lead to apodization (i.e. undesired intensity variations) at the pupil.

What is needed is a device that can provide polarization patterns, including radial and tangential patterns, without requiring excessively complicated mechanical structure.

SUMMARY OF THE INVENTION

The present invention overcomes the above-mentioned problems and provides further advantages.

The present invention relates to polarization pattern illumination. A polarization pattern assembly produces a polarization pattern. In an embodiment, a polarization pattern assembly includes a frame that supports a polarization pane in a central region of the frame. The polarization pane changes the polarization direction of light incident upon the polarization pane. The polarization pane comprises an optically active material.

Different polarization patterns in a pupil of an illuminator can then be generated by illuminating the polarization pattern assembly with linearly polarized light at a horizontal or vertical orientation. These patterns include three-zone hybrid polarization patterns, low sigma linear patterns, radial dipole patterns, tangential dipole patterns, tangential quadrapole patterns, and radial quadrapole patterns.

According to a preferred embodiment, the polarization pane comprises an optically active crystal consisting of said optically active material and having at least one optical crystal-axis, wherein said one optical crystal axis and a surface normal of said polarization pane are substantially parallel to each other.

An angle between said optical crystal axis and a surface normal of said polarization pane is preferably less than 9 mrad.

According to a preferred embodiment, said polarization pane changes a direction of polarization of a light bundle consisting of a multitude of light rays with an angle distribution relative to the optical crystal axis, wherein said angle distribution has a maximum angle of incidence not exceeding 100 mrad, preferably not exceeding 50 mrad, and still more preferably not exceeding 25 mrad.

The optically active crystal may e.g. comprise quartz, $TeO_2$ or $AgGaS_2$.

In a further embodiment, the polarization pane comprises an optically active liquid consisting of said optically active material and being enclosed in a housing, said housing being optically transparent to said light passing through the polarization pattern assembly.

According to a preferred embodiment, the polarization pane rotates the direction of polarization of light by approximately 90 degrees.

According to a preferred embodiment, the polarization pattern assembly comprises at least one region leaving a direction of polarization of light passing therethrough substantially unchanged. Such a design of the polarization pattern assembly enables an effective arrangement in providing desired polarization patterns, as discussed below in more detail, as well as an economic use of the optically active material, which does not have to extend beyond the whole cross sectional area of the polarization pattern assembly.

According to a further preferred embodiment, the polarization pattern assembly comprises on opposite sides of said polarization pane at least one pair of regions leaving a direction of polarization of light passing therethrough substantially unchanged.

The changing of the polarization direction of light passing through said polarization pane is preferably constant along a cross sectional area of said polarization pane.

The polarization pane may have the shape of one or more rectangular strips, which is particularly favourable with regard to a relatively simple manufacturing process.

According to a preferred embodiment, at least one polarization pane is coupled to said frame in a center region in between first and second outer regions within said frame, and the at least one polarization pane rotates the direction of polarization of light passing therethrough by approximately 90 degrees, whereby a polarization pattern can be obtained across the pupil of the illuminator, and the polarization pattern can include a pattern selected from a group including a three-zone hybrid polarization pattern, low sigma linear pattern, radial dipole pattern, tangential dipole pattern, tangential quadrapole pattern, and radial quadrapole patterns.

According to a further preferred embodiment, a central opening is provided, with one pair of polarization panes being coupled to said frame on opposite sides of said opening, and with one pair of regions leaving a direction of polarization of light passing therethrough substantially unchanged being coupled to said frame on opposite sides of said opening and circumferentially displaced with respect to said pair of polarization panes.

In a further embodiment, a polarized illuminator for a lithographic system is provided that includes a polarization pattern assembly. The polarization pattern assembly can be provided at or near a pupil plane or in any pupil space within the polarized illuminator.

According to a further feature, one or more beam shapers, such as a diffractive optical element or mask, can be provided on a common optical axis before or after a polarization pattern assembly. A beam shaper in combination with the polarization pattern assembly can further facilitate the generation of polarization patterns according to the present invention.

An advantage of embodiments of the present invention is that a polarization pattern assembly with a polarization pane can have a relatively simple structure yet is versatile. Such a polarization pattern assembly can produce a variety of polarization patterns by simply rotating the polarization pattern assembly relative to an incident beam, by rotating the direction of polarization of an incident beam, or by adding or modify a beam shaper.

Furthermore, and as explained below in more detail, the use of an optically active material, in particular of an optically active crystal whose optical crystal axis is parallel to the surface normal of the polarization pane in the polarization pattern assembly, results in a smooth and continuous variation of the polarization direction of passing linear polarized light as a function of thickness of the optically active material. Since the change of polarization direction of passing linear polarized light due to the circular birefringence is proportional to the thickness of the traversed optically active material, abrupt changes of the polarization state are avoided, thereby keeping moderate any requirements to thickness tolerances and manufacturing accuracy of the polarization pane.

A further advantage is realized for polarized illuminators in lithography as embodiments of the present invention can allow for a variety of polarization patterns at a particular pupil of interest.

Further embodiments, features, and advantages of the present invention, as well as the structure and operation of the various embodiments of the present invention, are described in detail below with reference to the accompanying drawings.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

FIGS. 1A-1B are diagrams of a polarization pattern assembly according to an embodiment of the present invention. FIG. 1A is a top view of the polarization pattern assembly. FIG. 1B is a side view of the polarization pattern assembly of FIG. 1A taken along line BB.

FIG. 2B is a diagram illustrating a three-zone hybrid polarization pattern created by a polarization pattern assembly illuminated with horizontally polarized incident light according to an embodiment of the present invention.

FIG. 2C is a diagram illustrating a three-zone hybrid polarization pattern created by a polarization pattern assembly illuminated with vertically polarized incident light according to an embodiment of the present invention.

FIG. 2D is a diagram further illustrating a beam shaper in combination with a polarization pattern assembly according to an embodiment of the present invention.

FIGS. 3A, 3B, 4A, 4B, 5A, 5B, 6A, and 6B illustrate various polarization patterns that can be generated according to embodiments of the present invention.

FIG. 8A is a top view of the polarization pattern assembly. FIG. 8B is a side view of the polarization pattern assembly of FIG. 8A taken along line BB.

FIG. 9A is a top view of the polarization pattern assembly. FIG. 9B is a side view of the polarization pattern assembly of FIG. 9A taken along line BB.

FIG. 10A is a top view of the polarization pattern assembly. FIG. 10B is a side view of the polarization pattern assembly of FIG. 10A taken along line BB.

DETAILED DESCRIPTION OF PREFERRED EMBODIMENTS

Reference will now be made to the drawings in which the various elements of the present invention will be given numerical designations and in which the invention will be discussed so as to enable one skilled in the art to make and use the invention.

FIGS. 1A-1B are diagrams of a polarization pattern assembly 100 according to a first embodiment of the present invention. As shown in FIG. 1A, polarization pattern assembly 100 includes a frame 110 that holds polarization pane 102 in a central region of frame 110.

According to the first embodiment, polarization pane 102 is made from a crystalline material showing circular birefringence, i.e. a so-called optical active material, for example but not limited to, crystalline quartz. Suited for this purpose are optically active crystals having at least one optical crystal axis and showing a sufficient transmittance in the desired wavelength regime being used.

Suitable optically active materials, dependent on the wavelength of the radiation being used, comprise e.g. quartz, $TeO_2$, and $AgGaS_2$. For example $TeO_2$ works in a range of wavelengths from 1000 nm down to 300 nm, $AgGaS_2$ works from 500 nm to 480 nm, and quartz from 800 nm below 193 nm and even down to 157 nm.

In an alternate embodiment of the invention, the polarization pane may also comprise an optically active liquid being enclosed in a housing that is optically transparent to the desired radiation passing through the polarization pattern assembly. Such a liquid or solution is regarded as suitable if it exhibits a sufficient optical activity while also showing a sufficient transmittance in the desired wavelength regime being used. Suitable optically active liquids or solutions are sugar solution (which may be regularly refreshed if necessary) or tartaric acid.

According to FIG. 1B, the crystalline material of polarization pane 102 is cut perpendicular to its optical crystal axis "OA", so that the latter is perpendicular to the surface of polarization pane 102 (i.e. parallel to its surface normal). Consequently, the propagation direction of a normal incident linearly polarized light beam traversing the polarization pane 102 is parallel with the optical crystal axis "OA" of the optical active material.

In traversing of linear polarized light through the optical active material of polarization pane 102, two circular waves (as components of the linear polarized light beam) get out-of-phase and appear to have rotated, after exit of polarization pane 102, by an angle of rotation depending on wavelength, temperature and thickness of the traversed optical active layer. Accordingly, polarization pane 102 can rotate the direction of polarization of light incident on the pane.

Figure 11:
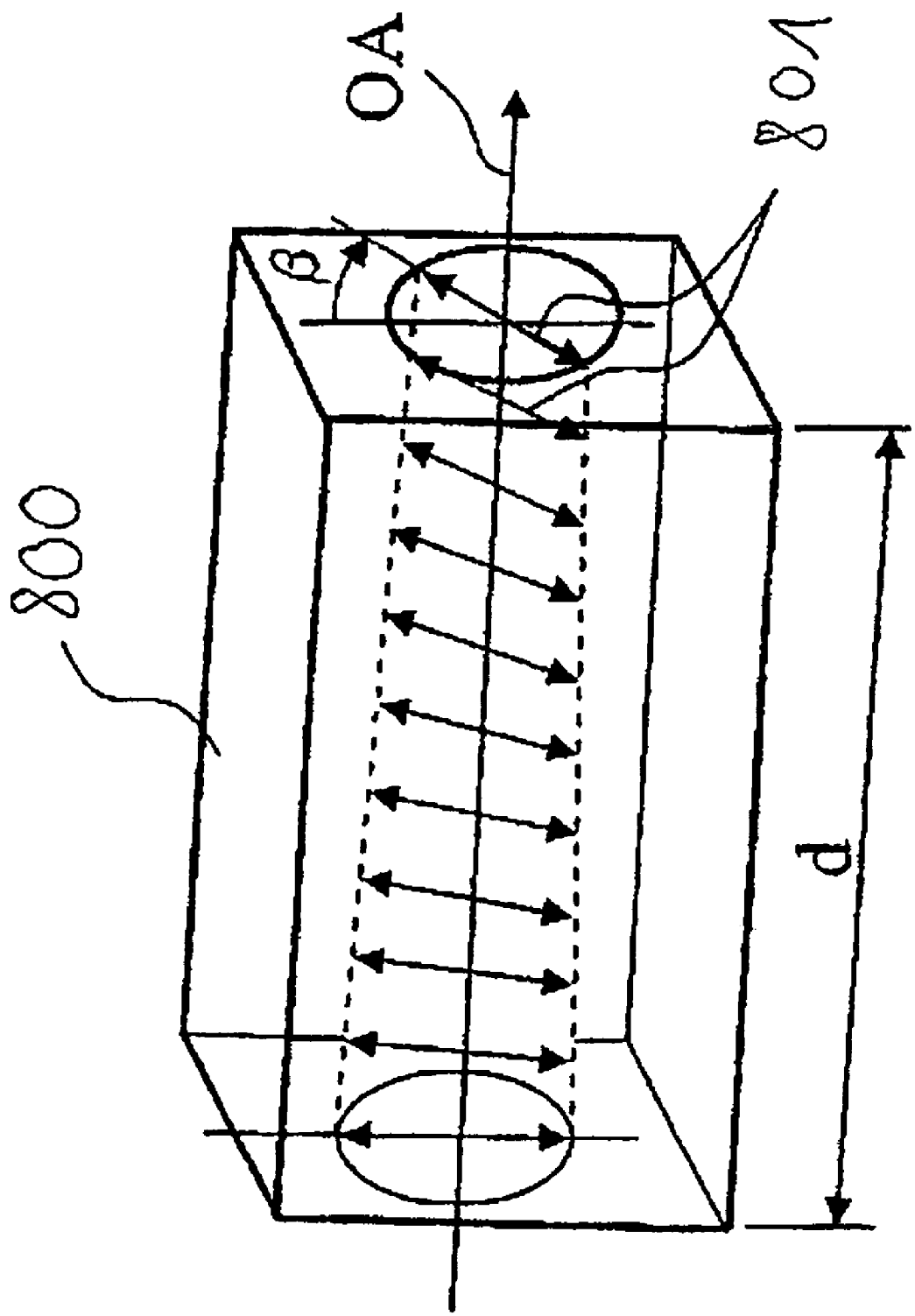
FIG. 11 is a schematic diagram illustrating how the plane of oscillation is rotated when a linearly polarized light ray propagates along the optical axis in an optically active crystal.

FIG. 11 shall serve to explain in more detail the function of optically active crystals, and in particular of polarization-modulating elements made from such crystals. Optically active crystals have at least one optical axis OA which is inherent in the crystal structure. When linearly polarized light travels along this optical axis OA, the plane of oscillation of electrical field vector 801 is rotated by an angle β of proportionate magnitude as the distance d traveled by the light inside crystal 800. The proportionality factor between distance d and angle of rotation β is the specific rotation α. The latter is a material-specific quantity and is dependent on the wavelength of the light rays propagating through the crystal. For example in natural quartz, the specific rotation at a wavelength of 193 nm was measured as (325.2±0.5)°/mm; in synthetic quartz, the specific rotation at a wavelength of 193 nm amounts to (323.1±0.5)°/mm. Both values are given for a temperature of 20° C.

In particular, light that propagates inside the crystal 800 along the optical axis OA is not subject to a linear birefringence. Thus, when a linearly polarized light ray traverses an optically active crystal 800 along the optical axis OA, its state of polarization remains the same except for the change in the spatial orientation of the plane of oscillation of electrical field vector 801 which depends on the distance d traveled by the light ray inside crystal 800.

In the meaning of the present application, and going back to FIGS. 1A and 1B, the definition that the optical crystal axis of polarization pane 102 is substantially parallel to its surface normal, such orientations are regarded as being comprised wherein an angle between an optical crystal axis of polarization pane 102 and its surface normal is less than 9 mrad, more preferably less than 5 mrad, and still more preferably less than 3 mrad.

In the exemplary embodiment of polarization pane 102 being made of crystalline quartz, the thickness "d" of polarization pane 102 along the optical crystalline axis can e.g. be selected as d=(N*278)±2 μm for an exemplarily temperature of 20° C., in order to achieve a net 90'-rotation of polarization direction, with N representing an odd positive number less than 10 (i.e. N=1, 3, . . . 9). Tolerances in thickness "d" of less than roughly 1% of polarization pane 102 have shown to be still acceptable and are lying within the range to achieve a net rotation of polarization direction of "substantially 90°".

Plates of crystalline quartz having the above orientations and manufacturing tolerances are commercially available in sizes of e.g. (50*130)mm², so that polarization pane 102 is realizable from one single piece thereby avoiding any undesired borders and enhanced design complexity.

Regions 104 and 106 shown in FIGS. 1A and 1B pass light through without significantly changing the direction of polarization. Accordingly, the polarization pattern assembly 100 comprises on opposite sides of polarization pane 102 one pair of regions 104 and 106 leaving a direction of polarization of light passing therethrough substantially unchanged.

According to the first embodiment of FIGS. 1A and 1B, regions 104 and 106 are devoid of any plate, pane or the like, i.e. realized as solid-material-free regions.

Figure 8:
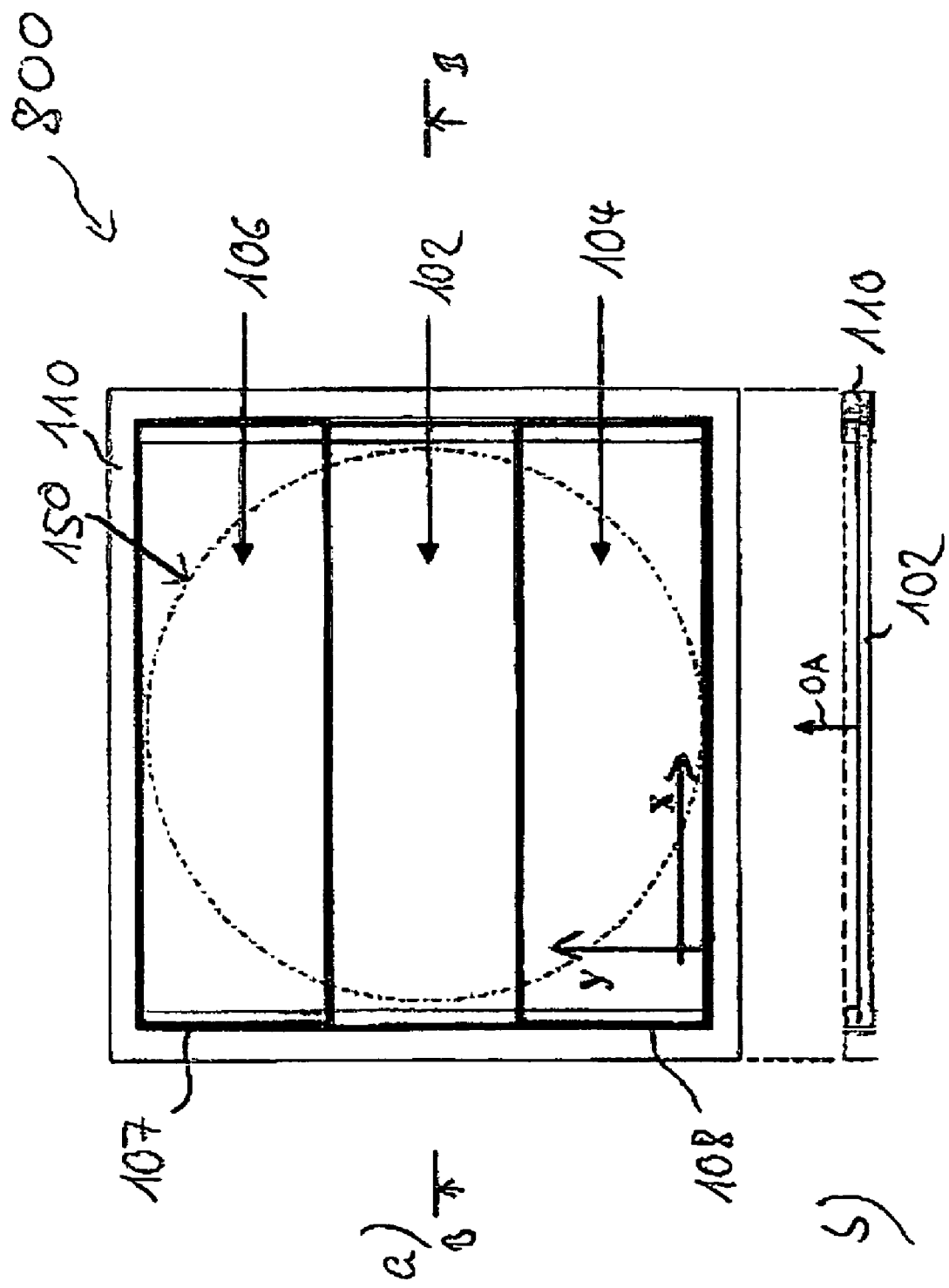
FIGS. 8A-8B are diagrams of a polarization pattern assembly according to a further embodiment of the present invention.

In an alternate embodiment of a polarization pattern assembly 800 shown in FIGS. 8A and 8B, regions 104 and 106 can be realized by providing, in each of regions 104 and 106, a pane 107 or 108, respectively, each being made of non-birefringent and non-optically active material, for example but not limited to fused silica or calcium fluoride ($CaF_2$). Accordingly, also the polarization pattern assembly 800 shown in FIGS. 8A and 8B comprises on opposite sides of polarization pane 102 one pair of regions 104 and 106 leaving a direction of polarization of light passing therethrough substantially unchanged.

Panes 107 and 108 in polarization pattern assembly 800 help to reduce an undesired intensity variation due to significantly different light attenuations in regions 104, 106 and pane 102 (so-called "polbalance"), as well as path length differences between rays travelling through polarization pattern assembly 100. To optimally meet the latter task, the thicknesses of panes 102, 107 and 108 preferably meet an equation $n_1*d_1=n*d\ n_2*d_2$, wherein $n_1$ and $n_2$ denote the refractive index of pane 107 or 108, respectively, $d_1$ and $d_2$ denote the thickness of pane 107 or 108, respectively, n denotes the refractive index of pane 102, and d denotes the thickness of panes 102. If the above equation is met, the optical path lengths of light rays passing panes 102, 107 and 108 are substantially equal.

In general, frame 110 can be any shape and area suitable for holding panes 102-106 in accordance with a desired form factor or other design criteria. In an embodiment, pane 102 and regions 104, 106 are rectangular (or square) and frame 110 likewise has a rectangular (or square) shape and an area large enough to hold pane 102 as shown in FIGS. 1A-1B or panes 102, 107 and 108 shown in FIG. 1C. The present invention is however not intended to be so limited, and other shapes can be used for panes 102, 107 and 108, regions 104, 106 and frame 110 as would be apparent to a person skilled in the art given this description.

Polarization pattern assembly 100 or 800 can be inserted in an optical path of any optical system including, but not limited to, an illuminator having a pupil plane. FIGS. 1A and 8A further show an imaging area 150 that can correspond to the area of polarization pattern assembly 100 that falls within a pupil of an optical system (not shown). In the examples of FIG. 1A and FIG. 8A, imaging area 150 has three zones corresponding to respective areas of panes 102-106. Since polarization pane 102 has a different polarization property than regions 104 and 106, a polarization pattern will be imparted across a pupil of the optical system.

Figure 2A:
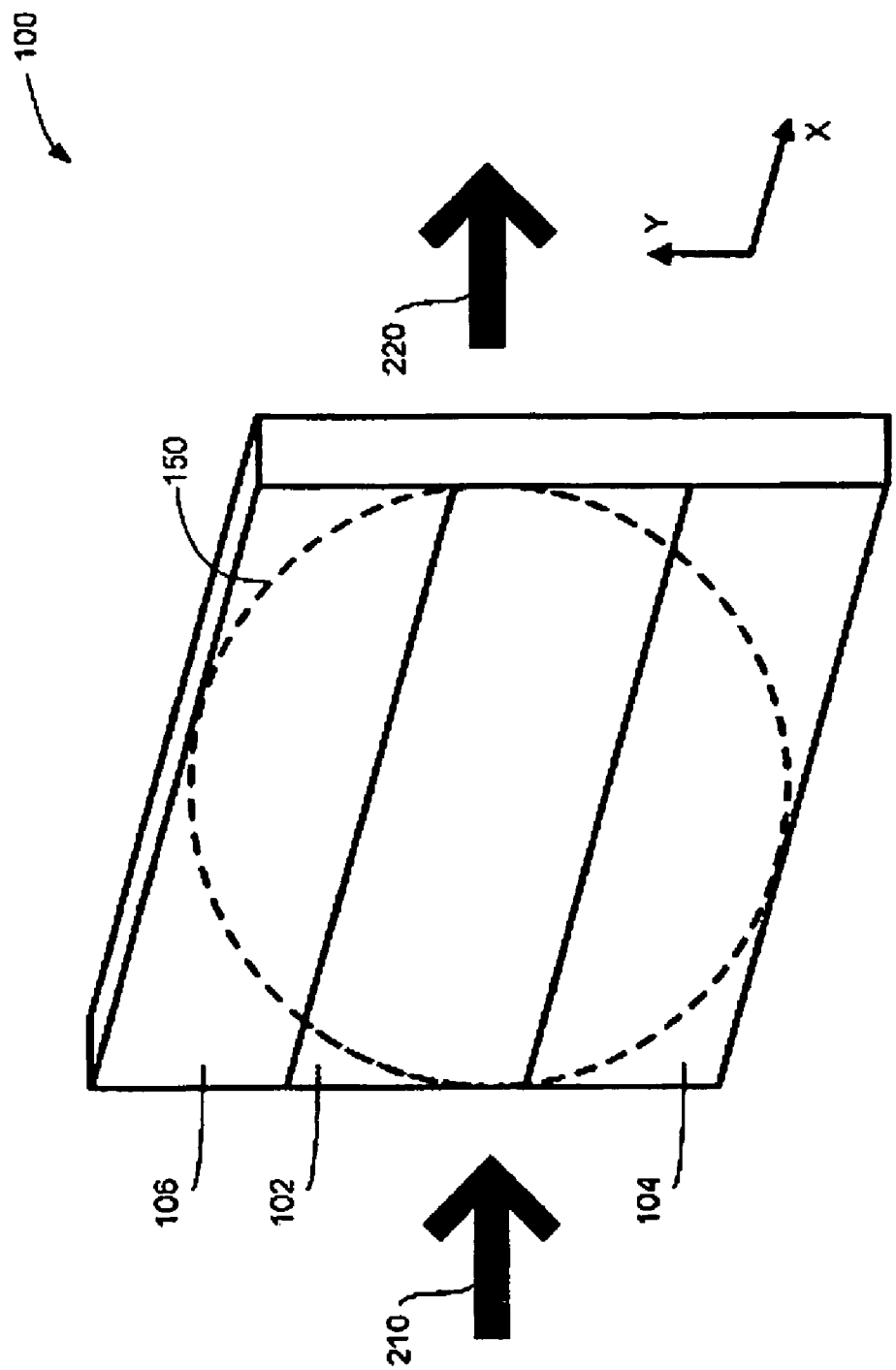
FIG. 2A is a diagram illustrating three zones of polarization created along a cross-section of an incident light beam by a polarization pattern assembly according to an embodiment of the present invention.

The operation of polarization assembly 100 or 800 including the generation of particular polarization patterns is described further with respect to FIGS. 2-6 (in the following exemplarily for but not limited to polarization assembly 100). Three-zone hybrid polarization patterns can be created. In FIG. 2A, an incident light beam 210 passes through polarization pattern assembly 100 which outputs an output beam 220. Incident light beam 210 can be linearly polarized along an x-axis (also called a horizontal direction). FIG. 2B shows a resultant three-zone hybrid polarization pattern 230 created by polarization pattern assembly 100 when illuminated with an incident light beam 210 that is linearly polarized in a horizontal direction. Pattern 230 includes a center zone 232 in between two outer zones 234, 236. Light in center zone 232 has passed through polarization pane 102 and is now vertically polarized. Light in outer zone 234 has passed through region 104 and remains horizontally polarized. Light in outer zone 236 has passed through region 106 and also remains horizontally polarized.

Alternatively, incident light beam 210 can be linearly polarized along a y-axis (also called a vertical direction). FIG. 2C shows a resultant three-zone hybrid polarization pattern 240 created by polarization pattern assembly 100 when illuminated with an incident light beam 210 that is linearly polarized in a vertical direction. Pattern 240 includes a center zone 242 in between two outer zones 244, 246. Light in center zone 242 has passed through polarization pane 102 and is now horizontally polarized. Light in outer zone 244 has passed through region 104 and remains vertically polarized. Light in outer zone 246 has passed through region 106 and also remains vertically polarized.

In this way, an advantage of polarization pattern assembly 100 is that different polarization patterns can be attained simply by inputting horizontally or vertically polarized light. This could be achieved in a number of ways including but not limited to: providing a linear polarizer at a source and rotating the polarizer in a horizontal or vertical orientation relative to polarization pattern assembly 100 and/or rotating polarization pattern assembly 100 relative to a linearly polarized light source.

According to a further feature, a beam shaper can also be provided in combination with a polarization pattern assembly to generate additional patterns. FIG. 2D is a diagram illustrating a beam shaper 250 in combination with a polarization pattern assembly 100 according to an embodiment of the present invention. Beam shaper 250 can be a diffractive optic or mask that shapes an incident beam 210 and then passes the shaped beam to polarization pattern assembly 100 which outputs an output beam 260. Alternatively, beam shaper 250 can be provided on the other side of polarization pattern assembly 100 to receive light that has passed through polarization pattern assembly 100. FIGS. 3A, 3B, 4A, 4B, 5A, 5B, 6A, and 6B illustrate additional polarization patterns that can be generated using a beam shaper 250 in combination with polarization pattern assembly 100 according to embodiments of the present invention.

Low sigma linear patterns can be created (FIGS. 3A and 3B). FIG. 3A shows a resultant low sigma linear vertical polarization pattern 300A created by polarization pattern assembly 100 when pane 102 is illuminated with an incident light beam 210 that is linearly polarized in a horizontal direction. Pattern 300A includes a center zone 310A surrounded by a concentric outer zone 320A. Light in center zone 310A has passed through polarization pane 102 and is now vertically polarized. Light is not present in outer zone 320A due to beam shaper 250. Beam shaper 250 can be a mask having a concentric circle shape that occludes light in zone 320A. Alternatively, beam shaper 250 can be diffractive optics or other types of optical components that direct incident light only to pane 102 in zone 310A. Beam shaper 250 can even be omitted if an incident beam size is narrow enough to impinge only on pane 102.

Similarly, FIG. 3B shows a resultant low sigma linear horizontal polarization pattern 300B created by polarization pattern assembly 100 when pane 102 is illuminated with an incident light beam 210 that is linearly polarized in a vertical direction. Pattern 300B includes a center zone 310B surrounded by a concentric outer zone 320B. Light in center zone 310B has passed through polarization pane 102 and is now horizontally polarized. Light is not present in outer zone 320B due to beam shaper 250 or beam size as described above with respect to FIG. 3A.

In this way, an advantage of polarization pattern assembly 100 is that either low sigma linear polarization patterns (horizontal or vertical) can be attained simply by inputting horizontally or vertically polarized light.

Tangential and radial quadrapole patterns can be created (FIGS. 4A and 4B). FIG. 4A shows a resultant tangential quadrapole polarization pattern 400A created by polarization pattern assembly 100 and beam shaper 250 when illuminated with an incident light beam 210 that is linearly polarized in a horizontal direction. Pattern 400A includes four pole regions 410A, 412A, 414A, and 416A having tangential polarized light. Pole regions 910A, 412A, 414A, and 416A can be formed around in outer peripheral zone of a pupil by beam shaper 250. Light in pole regions 414A, 416A has passed through polarization pane 102 and is now vertically polarized. Light in pole region 410A has passed through region 106 and remains horizontally polarized. Light in pole region 412A has passed through region 104 and also remains horizontally polarized. Light is not present in a spoke wheel shape zone 420A. Beam shaper 250 can be a mask having a spoke wheel shape that occludes light in zone 420A. Alternatively, beam shaper 250 can be diffractive optics or other types of optical components that direct incident light only to regions of polarization pattern assembly 100 corresponding to pole regions 410A, 412A, 414A, and 416A.

FIG. 4B shows a resultant radial quadrapole polarization pattern 400B created by polarization pattern assembly 100 and beam shaper 250 when illuminated with an incident light beam 210 that is linearly polarized in a vertical direction. Pattern 400B includes four pole regions 410B, 412B, 414B and 416B having radial polarized light. Pole regions 410B, 412B, 414B, and 416B can be formed around in outer peripheral zone of a pupil by beam shaper 250. Light in pole regions 414B, 416B has passed through polarization pane 102 and is now horizontally polarized. Light in pole region 410B has passed through region 106 and remains vertically polarized. Light in pole region 412B has passed through region 104 and also remains vertically polarized. Light is not present in a spoke wheel shape zone 420B. Beam shaper 250 can be a mask having a spoke wheel shape that occludes light in zone 420B.

Alternatively, beam shaper 250 can be diffractive optics or other types of optical components that direct incident light only to regions of polarization pattern assembly 100 corresponding to pole regions 410B, 412B, 414B, and 416B. In this way, an advantage of polarization pattern assembly 100 in combination with beam shaper 250 is that tangential and radial quadrapole patterns can be attained simply by inputting horizontally or vertically polarized light.

Radial dipole patterns can be created (FIGS. 5A and 5B). FIG. 5A shows a resultant radial dipole polarization pattern 500A created by polarization pattern assembly 100 and beam shaper 250 when illuminated with an incident light beam 210 that is linearly polarized in a vertical direction. Pattern 500A includes two pole regions 510A, 512A having radial polarized light. Pole regions 510A, 512A can be formed around at the top and bottom of an outer peripheral zone of a pupil by beam shaper 250. Light in pole region 510A has passed through region 106 and remains vertically polarized. Light in pole region 512A has passed through region 104 and also remains vertically polarized. Light is not present in a bow tie shape zone 520A. Beam shaper 250 can be a mask having a bow tie shape that occludes light in zone 520A. Alternatively, beam shaper 250 can be diffractive optics or other types of optical components that direct incident light only to regions of polarization pattern assembly 100 corresponding to pole regions 510A, 512A.

FIG. 5B shows a resultant radial dipole polarization pattern 500B created by polarization pattern assembly 100 and beam shaper 250 when illuminated with an incident light beam 210 that is linearly polarized in a vertical direction. Pattern 500B includes two pole regions 510B, 512B having radial polarized light. Pole regions 510B, 512B can be formed around at left and right sides of an outer peripheral zone of a pupil by beam shaper 250. Light in pole regions 510B, 512B has passed through polarization pane 102 and is vertically polarized. Light is not present in a bow tie shape zone 520B. Beam shaper 250 can be a mask having a bow tie shape that occludes light in zone 520B. Alternatively, beam shaper 250 can be diffractive optics or other types of optical components that direct incident light only to regions of polarization pattern assembly 100 corresponding to pole regions 510B, 512B.

In this way, an advantage of polarization pattern assembly 100 in combination with beam shaper 250 is that radial dipole patterns can be attained simply by inputting vertically polarized light and using beam shaper 250 to direct light to top and bottom regions or left and right side regions. For example, when beam shaper 250 is a bowtie-shaped mask it can be simply be rotated to occlude light in zone 520A or 520B.

Tangential dipole patterns can be created (FIGS. 6A and 6B). FIG. 6A shows a resultant tangential dipole polarization pattern 600A created by polarization pattern assembly 100 and beam shaper 250 when illuminated with an incident light beam 210 that is linearly polarized in a horizontal direction. Pattern 600A includes two pole regions 610A, 612A having tangential polarized light. Pole regions 610A, 612A can be formed at the left and right of an outer peripheral zone of a pupil by beam shaper 250. Light in pole regions 610A, 612A has passed through polarization pane 102 and is vertically polarized. Light is not present in a bow tie shape zone 620A. Beam shaper 250 can be a mask having a bow tie shape that occludes light in zone 620A. Alternatively, beam shaper 250 can be diffractive optics or other types of optical components that direct incident light only to regions of polarization pattern assembly 100 corresponding to pole regions 610A, 612A.

FIG. 6B shows a resultant tangential dipole polarization pattern 600B created by polarization pattern assembly 100 and beam shaper 250 when illuminated with an incident light beam 210 that is linearly polarized in a horizontal direction. Pattern 600B includes two pole regions 610B, 612B having tangential polarized light. Pole regions 610B, 612B can be formed at a top and bottom of an outer peripheral zone of a pupil by beam shaper 250. Light in pole region 610B has passed through region 106 and remains horizontally polarized. Light in pole region 612B has passed through region 104 and also remains horizontally polarized. Light is not present in a bow tie shape zone 620B. Beam shaper 250 can be a mask having a bow tie shape that occludes light in zone 620B. Alternatively, beam shaper 250 can be diffractive optics or other types of optical components that direct incident light only to regions of polarization pattern assembly 100 corresponding to pole regions 610B, 612B.

In this way, a further advantage of polarization pattern assembly 100 in combination with beam shaper 250 is that tangential dipole patterns can be attained simply by inputting horizontally polarized light and using beam shaper 250 to direct light to top and bottom regions or left and right side regions. For example, when beam shaper 250 is a bowtie shaped mask it can be simply rotated to occlude light in zone 620A or 620B.

Figure 9:
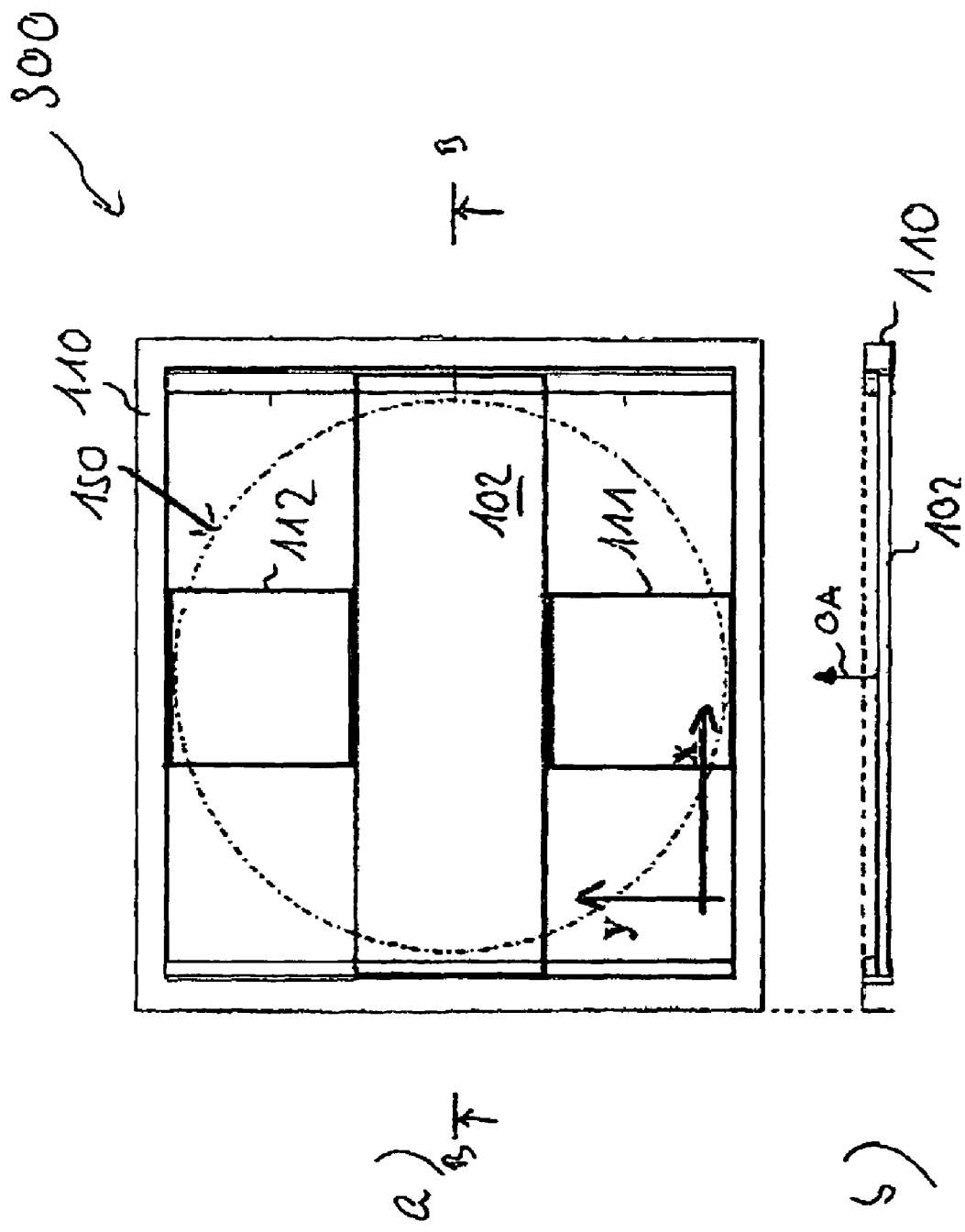
FIGS. 9A-9B are diagrams of a polarization pattern assembly according to a further embodiment of the present invention.
Figure 10:
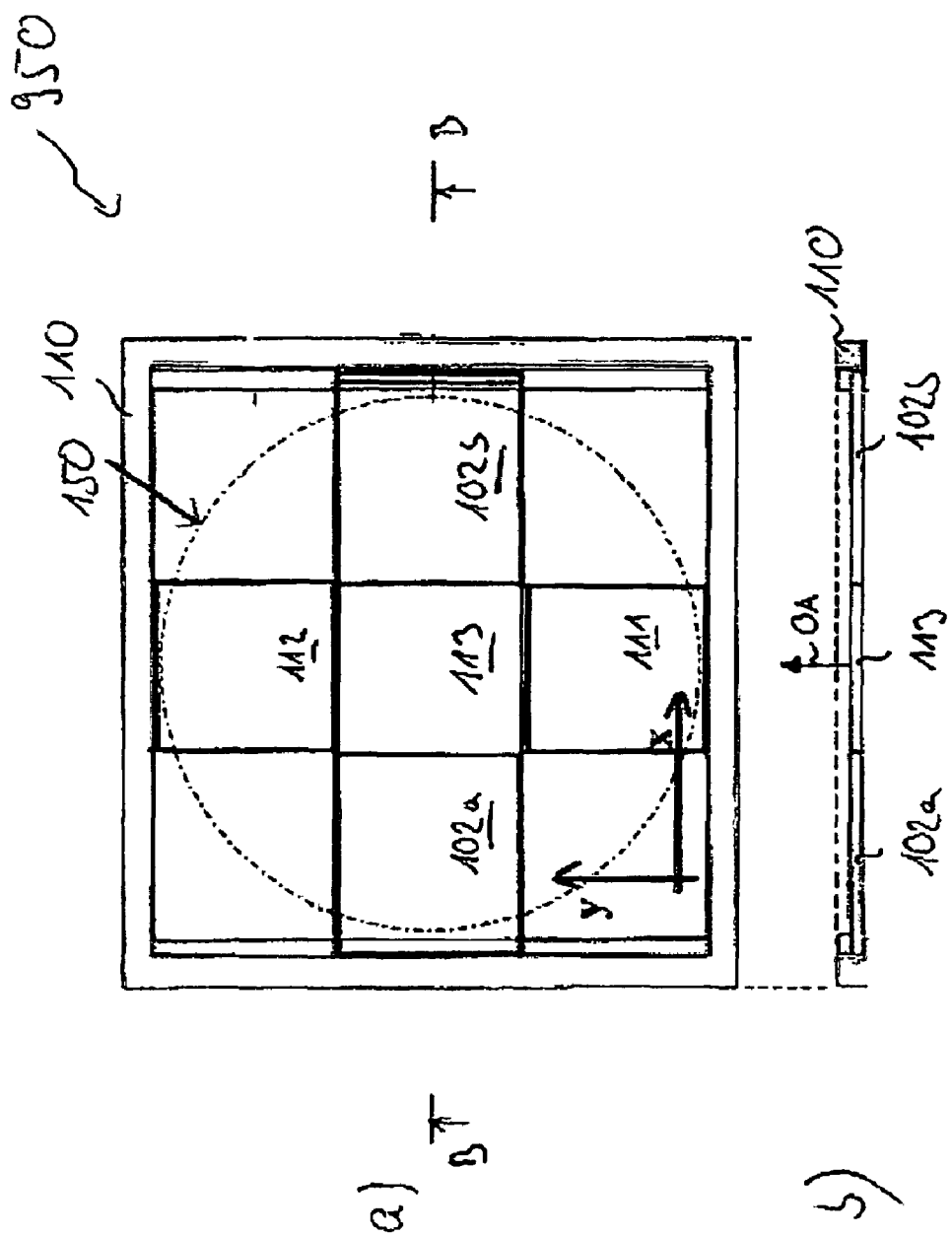
FIGS. 10A-10B are diagrams of a polarization pattern assembly according to a further embodiment of the present invention.

FIGS. 9A and 9B as well as FIGS. 10A and 10B show further embodiments of a polarization pattern assembly according to the present invention, which are principally based on the embodiment already described with reference to FIGS. 8A and 8B, but modified in order to achieve a saving of the usually expensive material used to realize regions 104, 106 and/or polarization pane 102.

According to the embodiment of FIGS. 9A and 9B, the polarization pattern assembly 900 also comprises on opposite sides of polarization pane 102 one pair of regions leaving a direction of polarization of light passing therethrough substantially unchanged.

Similar to the embodiment of a polarization pattern assembly 800 shown in FIGS. 8A and 8B, regions 104 and 106 are realized by providing, in each of regions 104 and 106, a pane 111 or 112, respectively, each being made of non-birefringent and non-optically active material, for example but not limited to fused silica or calcium fluoride ($CaF_2$).

The only difference with respect to FIGS. 8A and 8B is that panes 111 and 112 of polarization pattern assembly 900 do not extend over the whole region 104 or 106, respectively, but have a reduced dimension and size in order to cover substantially only a region of interest, e.g. an area which is in fact traversed by irradiation. Since the remaining features of polarization pattern assembly 900 shown in FIGS. 9A and 9B correspond to those of polarization pattern assembly 800 shown in FIGS. 8A and 8B, corresponding elements have been marked with same reference signs and their detailed description is omitted.

The exemplary embodiment of FIGS. 9A and 9B is particularly suitable for dipole or quadrapole illumination modes, in order to provide e.g. the dipole or quadrapole polarization patterns discussed above with reference to FIG. 4A (tangential quadrapole), FIG. 4B (radial quadrapole), FIG. 5A (radial dipole) and FIG. 6B (tangential dipole).

Like panes 107 and 108 in embodiment of FIGS. 8A and 8B, size-reduced panes 111 and 112 meet their task to reduce undesired intensity variations and path length differences, while also saving material in some, most or all the remaining region not passed by irradiation. Like in the embodiment of FIGS. 8A and 8B, the thicknesses of panes 102, 111 and 112 preferably meet an equation $n_1*d_1=n*d\ n_2*d_2$, wherein $n_1$ and $n_2$ denote the refractive index of pane 111 or 112, respectively, $d_1$ and $d_2$ denote the thickness of pane 111 or 112, respectively, n denotes the refractive index of pane 102, and d denotes the thickness of panes 102. If the above equation is met, the optical path lengths of light rays passing panes 102, 111 and 112 are substantially equal.

Panes 111 and 112 can be of any shape and area suitable for meeting the above tasks. Although in the embodiment of FIGS. 8A and 8B, panes 102, 111 and 112 are rectangular (or, square), the present invention is not intended to be so limited and other suitable-shapes can be used for panes 102, 111 and 112.

Going now to FIG. 10A and FIG. 10B, regions 104 and 106 are (like in FIG. 9A and FIG. 9B) realized by providing, in each of regions 104 and 106, a pane 111 or 112, respectively, each being made of non-birefringent and non-optically active material, for example but not limited to fused silica or calcium fluoride ($CaF_2$). Accordingly, the polarization pattern assembly 950 also comprises on opposite sides of a polarization pane one pair of regions leaving a direction of polarization of light passing therethrough substantially unchanged.

The only difference with respect to FIGS. 9A and 9B is that a polarization pane of polarization pattern assembly 950 does not extend over the whole central region between regions 104 and 106, but comprises two separate panes 102a and 102b, both being plan-parallel and made of an optically active crystal. The only difference between panes 102a,b and pane 102 is that panes 102a and 102b have a reduced dimension and size in order to cover substantially only a region of interest, e.g. an area which is in fact traversed by irradiation. In polarization pattern assembly 950, a central opening 113 (at the position of the optical axis OA illustrated in FIG. 10B) is provided within frame 110, with polarization panes 102a and 102b being coupled to frame 110 on opposite sides of opening 113, and with the pair of regions 111 and 112 leaving a direction of polarization unchanged being arranged on opposite sides of opening 113 and circumferentially displaced by 90° with respect to polarization panes 102a or 102b, respectively. Since the remaining features of the polarization pattern assembly 950 shown in FIGS. 10A and 10B correspond to those of polarization pattern assembly 900 of FIGS. 9A and 9B, corresponding elements have been marked with same reference signs and their detailed description is omitted.

Of course, the invention is not limited to the specific shape, size and arrangement shown in FIGS. 10A and 10B, so other suitable arrangements are apparent to a skilled person given this description in order to cover substantially only a region of interest, e.g. an area which is in fact traversed by irradiation, with the respective optically active material (for panes 102, 102a, 102b) or with the non-birefringent and non optically active material (for regions 111, 112).

Like the exemplary embodiment of FIGS. 9A and 9B, also the exemplary embodiment of FIGS. 10A and 10B is particularly suitable for dipole or quadrapole illumination modes, in order to provide e.g. the dipole or quadrapole polarization patterns discussed above with reference to FIG. 4A (tangential quadrapole), FIG. 4B (radial quadrapole), FIG. 5A (radial dipole) and FIG. 6B (tangential dipole).

Figure 7:
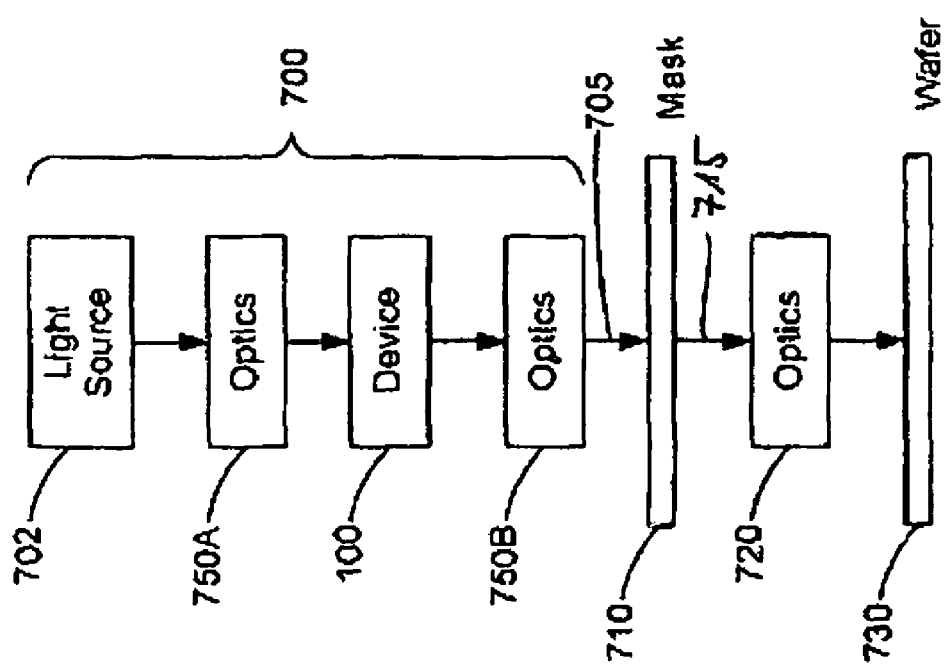
FIG. 7 is a diagram illustrating a polarized illuminator including a polarization pattern assembly in a lithographic system according to an embodiment of the present invention.

FIG. 7 is a diagram illustrating a polarized illuminator 700 including a polarization pattern assembly 100 (or alternatively e.g. a polarization pattern assembly 800, 900, 950, . . . ) and/or beam shaper 750 in a lithographic system according to an embodiment of the present invention. Beam, shaper 750 and polarization pattern assembly 100 are arranged along a common optical path of illuminator 700. Beam shaper 750 can include first beam shaper element 750A and second beam shaper element 750B disposed on opposite sides of polarization pattern assembly 100 as shown in FIG. 7. In one example, first beam shaper element 750A includes one or more diffractive optics (e.g. diffraction gratings) that diffract light from a light source 702 (e.g., a ultraviolet laser) into two or four diffracted beams corresponding to poles regions around a pupil of illuminator 700. Other optical lenses or components can also be provided to fill a pupil and/or field of illuminator 700 as is well-known in illuminator design. Second beam shaper element 750B can include a mask to further block undesired rays and otherwise clean up the polarization pattern at the pupil.

Polarized illuminator 700 outputs an output beam 705 of polarized illumination to mask 710. Light 715 passing through (or reflected from) mask 710 is projected by an optical system 720 (i.e., projection optics) onto a wafer 730 during printing. This lithography system used with polarized illuminator 700 is illustrative and not intended to limit the present invention. Polarized illuminator 700 can be used in any type of lithographic system or tool as would be apparent to a person skilled in the art given this description.

According to a further feature of the present invention, output beam 705 can have any of a variety of polarization patterns at a pupil of illuminator 700 including, but not limited to, three-zone hybrid polarization patterns, low sigma linear patterns, radial dipole patterns, tangential dipole patterns, tangential quadrapole patterns, and radial quadrapole patterns. Depending upon the configuration of beam shaper 750 and polarization pattern assembly 100, polarized illuminator 700 can provide any of these patterns as described above with respect to FIGS. 2B-6B. Further, polarized illuminator 700 can be switched to provide any of these patterns depending upon the configuration of beam shaper 750 and polarization pattern assembly 100 as described above with respect to FIGS. 2B-6B. For instance, a controller (not shown) can be provided to change the configuration of beam shaper 750 and polarization pattern assembly 100 to obtain a desired pattern. In this way patterns can be automatically changed during printing to allow different polarization patterns in a pupil during exposure of a wafer. For example, a controller can move one or more diffraction gratings in beam shaper element 750A in and out of the optical path to create two or four diffracted beams (+1, −1 or greater diffracted beam orders) at the pole regions (for dipole or quadrapole patterns), and/or to simply pass a lower order-beam for low order sigma linear patterns. Likewise, polarization pattern assembly 100 can be rotated around an optical axis of the optical path so that input linearly polarized light is along a horizontal or vertical direction depending upon the polarization pattern which desired. Finally, one or more masks in beam shaper element 750B can also be moved in and out of the optical path through illuminator 700 and rotated so that a mask shape (e.g., a concentric circle, spoke-wheel or bow tie shape) in a desired orientation is present in accordance with the polarization pattern desired.

In certain lithographic applications, the polarization patterns illustrated in FIG. 3 may be advantageous for polarized illuminator 700 to provide. For example, such polarization modes are useful in double exposing the wafer with alternating phase shift masks. Specifically, alternating phase shift masks diffract the light in a different way from binary masks. In the case of alternating phase shift masks, the axial beam of the illuminator is diffracted symmetrically into the projection optics ("PO"). The smallest and sharpest features are achieved with a thin beam of illumination on axis. However, to get the benefit of polarization for several orientations of features at one time, one polarization can be used with a mask that has the vertically oriented structures. The wafer is then exposed again using a second polarization and a second mask with the horizontal structures.

Accordingly, the polarization patterns in FIG. 3 are useful for double exposure with alternating phase shift masks. For example, a mask with mostly vertical lines, i.e., the lines are vertical and repeat horizontally, diffracts mostly horizontally across the PO pupil. These beams recombine at the wafer more effectively if the polarization is vertical. Similarly, a second mask with mostly horizontal structures is imaged better with horizontal polarization. Both masks can be exposed onto the same wafer without "developing the film" in between and the resulting double exposure image is better than if the whole structure had been exposed at once with unpolarized light.

In a further embodiment, the polarization patterns listed in FIG. 4 may be desired in a lithographic application. For example, using a binary mask, the very smallest vertical lines are well imaged by the vertically polarized poles on the right and left edges of the illuminator pupil as shown in FIG. 4A. The +1 and −1 diffraction order from the other two poles are diffracted outside the PO pupil and do not make it to the wafer. Similarly, using a binary mask, the very smallest horizontal lines are well imaged by the horizontally polarized poles on the top and bottom portion of the illuminator pupil as shown in FIG. 4B. The enhancement in the contrast due to the tangential polarization in general more than makes up for the lost contrast due to the non-imaging poles. In this way, all features can be printed in a single exposure where, without polarization control, this would not be possible.

In another embodiment, the polarization patterns listed in FIGS. 5 and 6 are useful for double exposures of mostly horizontal and mostly vertical structures using binary masks. In the case of alternating phase shift masks, double exposures were chosen in order to receive the benefit of polarization. Double exposures are often used because for a given structure orientation, only two of the four poles produces an image. The other two poles do not. The +1 and −1 diffraction orders are outside the P.O. pupil. Only the zero order reaches the wafer providing no image and only contributing a contrast robbing constant background.

The present invention is not limited to lithography systems with optical systems producing the patterns of polarization described above or illustrated in the figures. Rather, for any given reticle or mask, there may be an optimal pupil fill and optimal polarization for printing. Accordingly, the present invention encompasses such optimal polarization patterns.

The polarization pane(s) used in the optical systems of the present invention can utilize optics-quality materials that transmit light of a wavelength of interest. Accordingly, the invention is not limited to use with any particular wave length of light. Example wavelengths are infrared, ultraviolet ("UV"), and visible.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

The invention claimed is:

1. A polarization pattern assembly for use in an illuminator having a pupil, comprising:
   a frame; and
   at least one polarization pane coupled to said frame, wherein said frame includes a center region in between first and second outer regions within said frame and wherein said at least one polarization pane is supported by said frame across the center region,
   said polarization pane comprising an optically active material and changing a direction of polarization of light passing therethrough, whereby at least one polarization pattern is obtained across the pupil of the illuminator;
   said first and second outer regions leaving a direction of polarization of light passing therethrough substantially unchanged.

2. The polarization pattern assembly of claim 1, wherein said at least one polarization pane comprises an optically active crystal having at least one optical crystal axis, wherein said optical crystal axis and a surface normal of said polarization pane are substantially parallel to each other.

3. The polarization pattern assembly of claim 2, wherein an angle between said optical crystal axis and said surface normal of said polarization pane is less than 9 mrad.

4. The polarization pattern assembly of claim 2, wherein said polarization pane changes a direction of polarization of a light bundle consisting of a multitude of light rays with an angle distribution relative to the optical crystal axis, wherein said angle distribution has a maximum angle of incidence not exceeding 100 mrad.

5. The polarization pattern assembly of claim 2, wherein said optically active crystal comprises quartz, $TeO_2$ or $AgGaS_2$.

6. The polarization pattern assembly of claim 1, wherein said at least one polarization pane comprises an optically active liquid consisting of said optically active material and being enclosed in a housing, said housing being optically transparent to said light passing through the polarization pattern assembly.

7. The polarization pattern assembly of claim 1, wherein said at least one polarization pane rotates the direction of polarization of light by approximately 90 degrees.

8. The polarization pattern assembly of claim 1, further comprising at least one region leaving a direction of polarization of light passing therethrough substantially unchanged.

9. The polarization pattern assembly of claim 8, comprising on opposite sides of said polarization pane at least one pair of regions leaving a direction of polarization of light passing therethrough substantially unchanged.

10. The polarization pattern assembly of claim 1, wherein said changing of the polarization direction of light passing through said polarization pane is constant along a cross sectional area of said polarization pane.

11. The polarization pattern assembly of claim 10, wherein said polarization pane has the shape of one or more rectangular strips.

12. The polarization pattern assembly of claim 1, wherein said at least one polarization pane is coupled to said frame in a center region in between first and second outer regions within said frame, and wherein said at least one polarization pane rotates the direction of polarization of light passing therethrough by approximately 90 degrees, whereby a polarization pattern can be obtained across the pupil of the illuminator, and the polarization pattern can include a pattern selected from a group including a three-zone hybrid polarization pattern, low sigma linear pattern, radial dipole pattern, tangential dipole pattern, tangential quadrapole pattern, and radial quadrapole patterns.

13. The polarization pattern assembly of claim 1, wherein a central opening is provided, with one pair of polarization panes being coupled to said frame on opposite sides of said opening, and with one pair of regions leaving a direction of polarization of light passing therethrough substantially unchanged being coupled to said frame on opposite sides of said opening and circumferentially displaced with respect to said pair of polarization panes.

14. An apparatus for providing at least one polarization pattern in a pupil of an illuminator for a lithography system, comprising:
   a beam shaper; and
   a polarization pattern assembly having a frame and at least one polarization pane comprising an optically active material, said beam shaper and said polarization pattern assembly being arranged along an optical path of the illuminator,
   wherein said frame includes a center region in between first and second outer regions within said frame and said at least one polarization pane is supported by said frame across the center region;
   wherein said first and second outer regions leave a direction of polarization of light passing therethrough substantially unchanged.

15. The apparatus of claim 14, wherein said at least one polarization pane comprises an optically active crystal having at least one optical crystal axis, wherein said optical crystal axis and a surface normal of said polarization pane are substantially parallel to each other.

16. The apparatus of claim 15, wherein an angle between said optical crystal axis and said surface normal of said polarization pane is less than 9 mrad.

17. The apparatus of claim 15, wherein said polarization pane changes a direction of polarization of a light bundle consisting of a multitude of light rays with an angle distribution relative to the optical crystal axis, wherein said angle distribution has a maximum angle of incidence not exceeding 100 mrad.

18. The apparatus of claim 15, wherein said optically active crystal comprises quartz, $TeO_2$ or $AgGaS_2$.

19. The apparatus of claim 14, wherein said at least one polarization pane comprises an optically active liquid consisting of said optically active material and being enclosed in a housing, said housing being optically transparent to said light passing through the polarization pattern assembly.

20. The apparatus of claim 14, wherein said at least one polarization pane rotates the direction of polarization of light by approximately 90 degrees.

21. The apparatus of claim 14, wherein said polarization pattern assembly comprises at least one region leaving a direction of polarization of light passing therethrough substantially unchanged.

22. The apparatus of claim 21, comprising on opposite sides of said polarization pane at least one pair of regions leaving a direction of polarization of light passing therethrough substantially unchanged.

23. The apparatus of claim 14, wherein a changing of a polarization direction of light passing through said polarization pane is constant along a cross sectional area of said polarization pane.

24. The apparatus of claim 23, wherein said polarization pane has the shape of one or more rectangular strips.

25. The apparatus of claim 14, wherein said beam shaper comprises at least one of diffractive optics and a mask.

26. The apparatus of claim 14, wherein said beam shaper separates an input linearly polarized light beam into a plurality of separate polarized light beams that illuminate the polarization pattern assembly at areas associated with pole regions of the pupil.

27. The apparatus of claim 26, wherein the plurality of separate polarized light beams comprise two polarized light beams that illuminate the polarization pattern assembly at areas associated with dipole regions of the pupil such that a polarization pattern can be provided at the pupil that comprises a radial dipole pattern or tangential dipole pattern.

28. The apparatus of claim 26, wherein the plurality of separate polarized light beams comprise four polarized light beams that illuminate the polarization pattern assembly at areas associated with quadrapole regions of the pupil such that a polarization pattern can be provided at the pupil that comprises a radial quadrapole pattern or tangential quadrapole pattern.

29. The apparatus of claim 26, wherein said beam shaper limits an input linearly polarized light beam to a polarization pane in the center region of the pupil such that a polarization pattern can be provided at the pupil that comprises a low sigma linear polarization pattern.

30. The apparatus of claim 26, wherein said beam shaper passes an input linearly polarized light beam across center and outer regions within the frame such that a polarization pattern can be provided at the pupil that comprises a three-zone hybrid polarization pattern.

31. The apparatus of claim 14, wherein said beam shaper and said polarization pattern assembly can be moved to generate different types of polarization patterns.

32. The polarization pattern assembly of claim 1, wherein said first and second outer regions comprise fused silica or calcium fluoride.

33. The polarization pattern assembly of claim 1, wherein said first and second outer regions comprise solid-material-free regions.

34. The polarization pattern assembly of claim 2, wherein said polarization pane changes a direction of polarization of a light bundle consisting of a multitude of light rays with an angle distribution relative to the optical crystal axis, wherein said angle distribution has a maximum angle of incidence not exceeding 50 mrad.

35. The polarization pattern assembly of claim 2, wherein said polarization pane changes a direction of polarization of a light bundle consisting of a multitude of light rays with an angle distribution relative to the optical crystal axis, wherein said angle distribution has a maximum angle of incidence not exceeding 25 mrad.

36. The apparatus of claim 15, wherein said polarization pane changes a direction of polarization of a light bundle consisting of a multitude of light rays with an angle distribution relative to the optical crystal axis, wherein said angle distribution has a maximum angle of incidence not exceeding 50 mrad.

37. The apparatus of claim 15, wherein said polarization pane changes a direction of polarization of a light bundle consisting of a multitude of light rays with an angle distribution relative to the optical crystal axis, wherein said angle distribution has a maximum angle of incidence not exceeding 25 mrad.

* * * * *

UNITED STATES PATENT AND TRADEMARK OFFICE
CERTIFICATE OF CORRECTION

PATENT NO.         : 7,916,391 B2
APPLICATION NO.    : 11/569001
DATED              : March 29, 2011
INVENTOR(S)        : Michael Albert et al.

It is certified that error appears in the above-identified patent and that said Letters Patent is hereby corrected as shown below:

| | |
|---|---|
| col. 6, line 16 | "90'" should be --90°-- |
| col. 6. line 54 | "$n_1*d_1 = n*d\ n_2*d_2$" should be --$n_1*d_1 \approx n*d \approx n_2*d_2$-- |
| col. 8, line 42 | "910A" should be --410A-- |
| col. 11, line 3 | "$n_1*d_1 = n*d\ n_2*d_2$" should be --$n_1*d_1 \approx n*d \approx n_2*d_2$-- |
| col. 11, line 29 | "plan-parallel" should be --plane-parallel-- |
| col. 13, line 22 | "order" should be --orders-- |

Signed and Sealed this
Twelfth Day of July, 2011

David J. Kappos
*Director of the United States Patent and Trademark Office*